(12) United States Patent
Groe et al.

(10) Patent No.: US 7,868,691 B2
(45) Date of Patent: Jan. 11, 2011

(54) COMMUTATING AMPLIFIER WITH WIDE DYNAMIC RANGE

(75) Inventors: John B. Groe, Poway, CA (US); Michael Naone Farias, San Diego, CA (US); Eric Shapiro, San Diego, CA (US)

(73) Assignee: Quintic Holdings, Santa Clara, CA (US)

( * ) Notice: Subject to any disclaimer, the term of this patent is extended or adjusted under 35 U.S.C. 154(b) by 58 days.

(21) Appl. No.: 12/351,461

(22) Filed: Jan. 9, 2009

(65) Prior Publication Data

US 2009/0231041 A1    Sep. 17, 2009

Related U.S. Application Data

(60) Provisional application No. 61/019,967, filed on Jan. 9, 2008.

(51) Int. Cl.
*H03F 1/02* (2006.01)
*H03F 1/14* (2006.01)

(52) U.S. Cl. ............................................. 330/9; 330/51
(58) Field of Classification Search ..................... 330/9, 330/51, 301
See application file for complete search history.

(56) References Cited

U.S. PATENT DOCUMENTS 3,988,689 A    10/1976   Ochi et al.

| | | | |
|---|---|---|---|
| 6,087,897 A | 7/2000 | Wang | |
| 6,380,806 B1 | 4/2002 | Ang | |
| 6,693,491 B1 * | 2/2004 | Delano | 330/282 |
| 7,298,203 B2 * | 11/2007 | Wang et al. | 330/9 |
| 7,486,137 B2 * | 2/2009 | Magoon et al. | 330/140 |
| 2003/0078016 A1 | 4/2003 | Groe | |
| 2006/0164167 A1 | 7/2006 | Hickling | |
| 2008/0136511 A1 | 6/2008 | Zolfaghari | |

FOREIGN PATENT DOCUMENTS

JP    07 283666 A    10/1995
JP    11 214935 A    8/1999

OTHER PUBLICATIONS

PCT International Search Report for PCT/US2009/030638, Sep. 4, 2009.
Abstract in English of Japanese Application Serial JP 07 283666 A, Oct. 27, 1995.
Abstract in English of Japanese Application Serial JP 11 214935 A, Aug. 6, 1999.

\* cited by examiner

*Primary Examiner*—Steven J Mottola
(74) *Attorney, Agent, or Firm*—Blairtech Solution LLC

(57) ABSTRACT

Variable gain commutating amplifier apparatus and methods for use in a polar modulator are described. The apparatus may include two or more commutating amplifier stages configured to be switched to an output load based on a desired amplitude and/or transmit power level. The amplifier stages may include cross-coupled differential pairs to cancel RF carrier feedthrough. An additional R-2R ladder circuit may be provided to further extend the dynamic range by reducing the output power at the lowest output stages.

25 Claims, 9 Drawing Sheets

Shunt Driver Stage with Switches to Switch On/Off

Polar Modulator
(Prior Art)

Double Balanced Mixer
(Prior Art)

Commutating Amplifier

Shunt Driver with M Active Stages

Shunt Driver Stage with Switches to Switch On/Off

Shunt Driver with only the Low Power Stage Active

Commutating Amplifier with Cross-coupled Devices to Reduce Feedthrough

Commutating Amplifier with Bias Current Applied to Cancelling Devices

Use of an R-2R Ladder to Scale Output
Power of the Commutating Amplifier

Commutating Amplifier with Extended Dynamic Range

COMMUTATING AMPLIFIER WITH WIDE DYNAMIC RANGE

RELATED APPLICATIONS

This application claims priority under 35 U.S.C. §119(e) to U.S. Provisional Patent Application Ser. No. 61/019,967, entitled COMMUTATING AMPLIFIER WITH WIDE DYNAMIC RANGE, filed on Jan. 9, 2008. This application is also related to U.S. Pat. No. 6,985,703 entitled DIRECT SYNTHESIS TRANSMITTER, issued on Jan. 10, 2006. The content of each of these applications is hereby incorporated by reference herein in its entirety for all purposes.

FIELD OF INVENTION

The present invention relates generally to variable gain amplifiers used in communication transmitters. More particularly but not exclusively, the present invention relates to a variable gain amplifier having a commutating structure configured to provide variable output power.

BACKGROUND

The signals transmitted in wireless communications systems often vary in strength and thus require the use of variable gain amplifiers in the radio transceiver. These variable gain amplifiers operate to compensate for changing path losses in the transmitted signal.

Ideally, the variable gain amplifier (VGA) provides amplification at low noise levels, adds little distortion, and consumes very little power. This is important because any distortion produced by the transmitter spills power into adjacent communication channels and thereby reduces system capacity. To minimize distortion, the bias current in the VGA and other circuits is typically high—an unwanted attribute for portable devices.

It would therefore be advantageous to have a VGA with low distortion and low power consumption.

SUMMARY

The present invention is directed generally to apparatus and methods for use in a polar modulator including variable gain amplifiers, based on a plurality of commutating amplifiers, for providing an adjustable output power level based on an amplitude modulation signal and/or power level control signal.

In one aspect, the present invention relates to a commutating amplifier apparatus for use in a polar modulator comprising a first commutating amplifier stage coupled to a load stage and a second commutating amplifier stage coupled in parallel with the first commutating amplifier stage and the load stage, wherein each of said first and said second commutating amplifier stages are configured to provide a predefined scaled output and wherein each of said commutating amplifier stages are configured to be selectively switched on or off in response to a switching signal.

In another aspect, the present invention relates to a commutating amplifier apparatus for use in a polar modulator comprising a plurality of commutating amplifier stages, wherein ones of the plurality of commutating amplifier stages are coupled to a load stage and a switching apparatus coupled to the ones of the plurality of commutating amplifier stages, wherein said switching apparatus is disposed to switch one or more of said plurality of commutating amplifier stages on or off in response to a power control signal.

In yet another aspect, the present invention relates to a method of providing an output signal in a polar modulator, comprising receiving, at a switching apparatus, a power control signal generating, based on the power control signal, a plurality of switching signals and switching on or off, based at least in part on one or more of said switching signals, the output of one or more of a plurality of commutating amplifier stages coupled to an output load of the polar modulator.

Additional aspects of the present invention are described below in conjunction with the appended drawings.

BRIEF DESCRIPTION OF DRAWINGS

The foregoing aspects and the attendant advantages of this invention will become more readily apparent by reference to the following detailed description when taken in conjunction with the accompanying drawings wherein.

DETAILED DESCRIPTION

Figure 1:
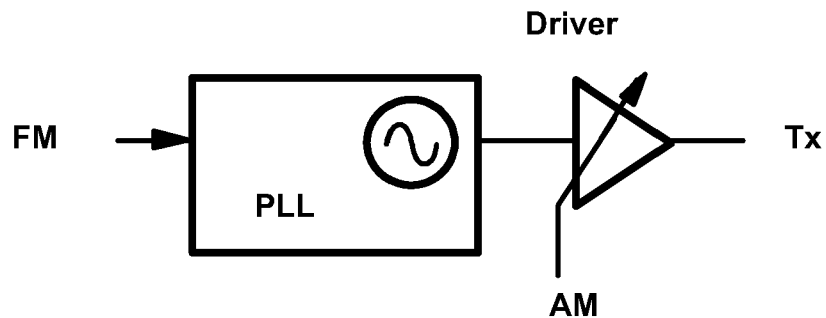
FIG. 1 shows a simplified diagram of a polar transmitter.

FIG. 1 illustrates a polar modulation transmitter. The transmitter operates efficiently due to its simplicity of design, which consists of a phase-locked loop (PLL) for providing phase/frequency modulation and an adjustable amplifier for providing amplitude/envelope modulation.

Figure 2:
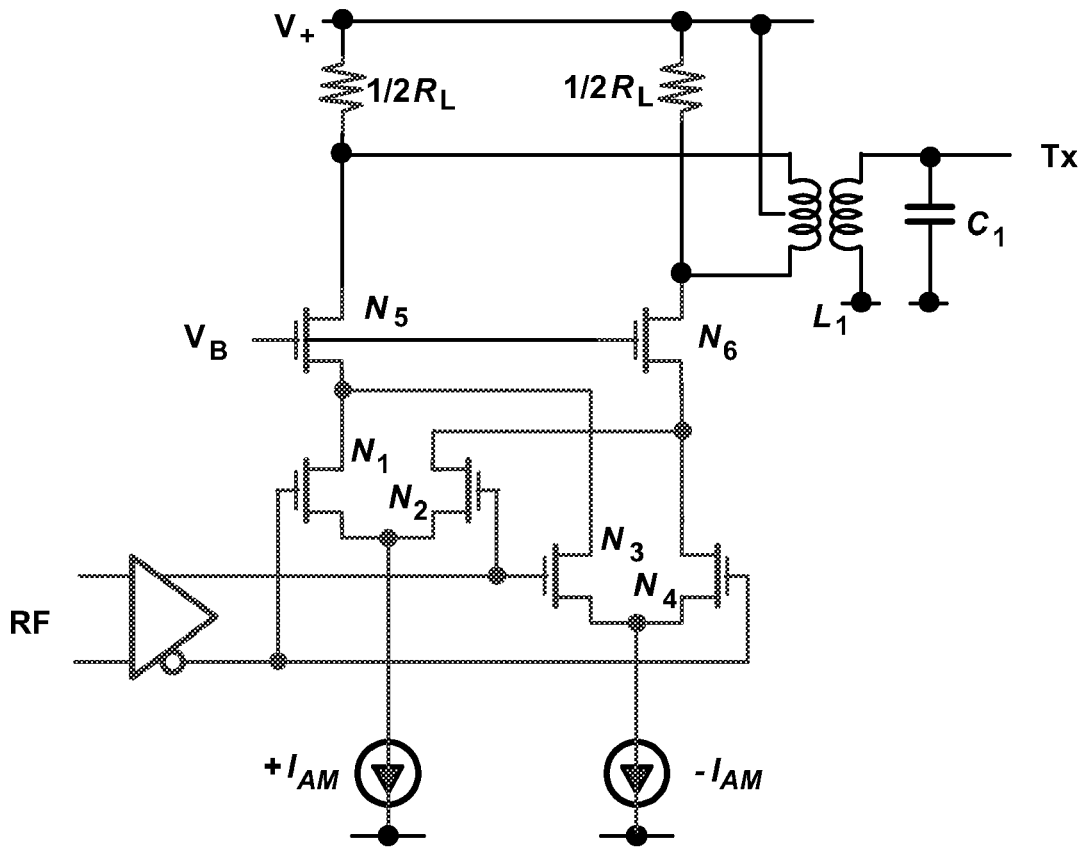
FIG. 2 is a schematic of a double-balanced mixer.

A double-balanced mixer can be used to amplitude modulate an RF carrier as shown in FIG. 2. The mixer uses a phase/frequency-modulated RF carrier to switch the differential pairs formed by transistors $N_1$-$N_4$. This action translates the amplitude modulation signal represented by differential currents $+I_{AM}(t)$ and $-I_{AM}(t)$ to the transmit frequency. The devices $N_5$-$N_6$ serve as cascode stages that isolate the output swing from the differential pair switches and the signal sources. The load consists of back termination resistance $R_L$ having two components of value $\frac{1}{2}R_L$, balun $L_1$, and tuning capacitor $C_1$. These components transform the 50Ω terminal impedance to an internal resistance typically equal to 200Ω. The double-balanced mixer represents part of a direct upconversion polar transmitter.

To operate efficiently, the RF carrier signal must quickly and fully switch the commutating devices $N_1$-$N_4$. This action will aid in maximizing the output of the driver with $$v_{out}(t) = i_{AM}(t) R_{Leff}$$

where $i_{AM}(t)$ is the differential current corresponding to the amplitude modulation signal and $R_{Leff}$ is the effective load impedance at the RF transmit frequency. The large RF signal applied to the driver resembles a square wave and generates energy at the odd-harmonics of the RF carrier, albeit with decreasing strength. With the output network tuned to the RF carrier, the output network presents a lower effective load impedance $R_{Leff}$ at the higher harmonic frequencies. This aids in reducing the energy at harmonic frequencies of the RF carrier.

The required swing to fully switch the commutating devices is approximately equal to $$V_{Sw} \geq \sqrt{\frac{\max(i_{AM}(t))}{K}}$$

where $\max(i_{AM})$ is the peak value of signal and $K$ is the intrinsic gain of the MOS devices in the switching core. In practice, the parameter $K$ varies inversely with oxide thickness $t_{ox}$.

The driver commutates the signal current $I_{AM}$ to produce a square-wave output, which can be modeled using a Fourier series as $$i_{out}(t) = \frac{2}{\pi} i_{AM}(t) \left[ \sin 2\pi f_{RF} t + \frac{\sin 6\pi f_{RF} t}{3} + \ldots \right]$$

where $f_{RF}$ corresponds to the frequency of the RF signal, including any phase/frequency modulation. Since the fundamental term represents the intended transmit signal, the output signal current simply becomes $$i_{out}(t) = \frac{2}{\pi} i_{AM}(t) \sin 2\pi f_{RF} t.$$

Moreover, the overall efficiency can be represented by $$\eta = \frac{RMS(i_{out}(t))|_{f_{RF}}}{I_{DC}} \approx \frac{2}{\pi \rho}$$

where $RMS(i_{out})$ equals the root-mean-squared or effective output current and $\rho$ represents the peak-to-average ratio of the modulating signal $i_{AM}(t)$. Note that the RMS value approximately equals the reciprocal of the peak-to-average ratio.

Figure 3:
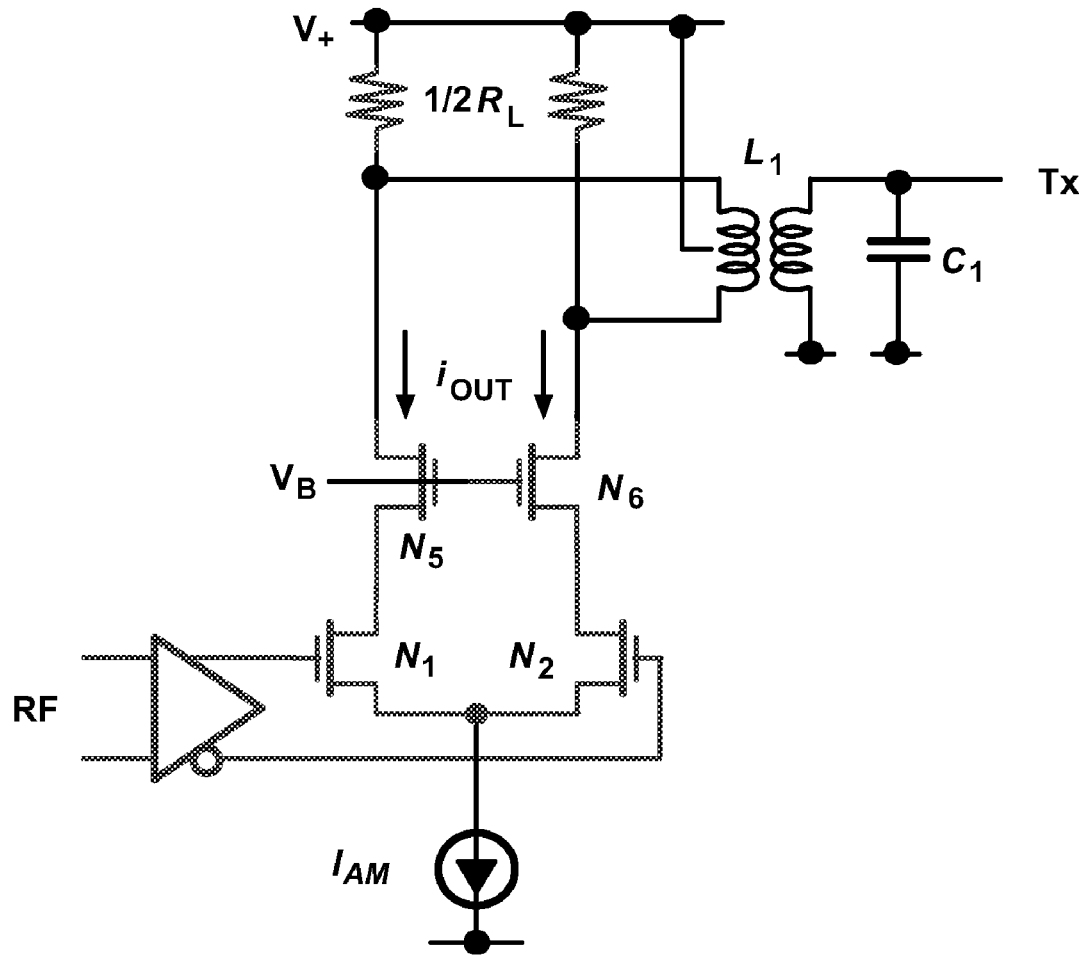
FIG. 3 is a schematic of an embodiment of a commutating amplifier that may be used in implementations of the present invention.

It is possible to simplify the amplitude modulation circuit shown in FIG. 2 and, in the process, improve its efficiency. Because the signal $i_{AM}(t)$ represents the amplitude of the modulated transmit signal, it will always be positive valued. This allows the double-balanced mixer to be reduced to a commutating amplifier as shown in the embodiment of FIG. 3.

One potential benefit of this circuit is that its current consumption tracks the signal $i_{AM}(t)$. As a result, the efficiency of the commutating amplifier remains relatively constant with the level of signal $i_{AM}(t)$, the efficiency being given by:

$$\eta = \frac{RMS(i_{out}(t))|_{f_{RF}}}{I_{DC}} \approx \frac{2}{\pi}$$

which is independent of $\rho$. Consequently, this implementation may provide a significant overall performance advantage when compared to the double-balanced mixer illustrated in FIG. 2.

Although the signal $i_{AM}(t)$ represents the amplitude or envelope variation of the complex transmit signal, in many applications it may also include information related to the transmit signal's power level. This is because amplitude and power level can be conveniently combined as follows:

$$i_{AM}(t) \rightarrow p_{Tx} \times i_{AM}(t)$$

where $p_{Tx}$ signifies the designated power control level. In practice, the amount of power control available in any circuit or system is usually limited by isolation effects.

The required power control range and ultimate system dynamic range depends on the application. GSM/EDGE systems rely on time division multiple access (TDMA), where users alternately use the RF channel. Timing slots define when signals can be transmitted. Each transmit burst must obey a mask that ramps the power up and down in a way that minimizes splatter. As such, the control range for the transmitter may approach 50-55 dB, although typically just the top 30 dB requires precise settings.

In contrast, WCDMA exploits code division multiple access (CDMA) schemes that permit users to share the same RF frequency channel. This is due to the orthogonal spreading codes assigned to each user that make the transmitted signals appear noise-like at the receiver. In practice, it's important to limit the total noise to maximize network capacity. As such, the network is typically configured to direct each transmitter to transmit at the power level that makes its received energy equal to the other users sharing the RF frequency channel. As a result, a typical WCDMA transmitter must accurately control its output power from a peak level of +24 dBm to below −50 dBm. This amounts to at least 74 dB of power control.

As previously mentioned, both the commutating driver and the double-balanced mixer require a large RF carrier signal to quickly and fully switch their commutating devices. Furthermore, this signal must remain fairly large even when the adjusted current $i_{AM}(t)$ drops to low levels (corresponding to low output power levels). At the same time, the components need to be sized to handle the operating current at full output power and must be fairly large. Consequently, these devices typically possess large capacitances that form a parasitic leakage path for the RF carrier signal to the RF output.

Figure 4A:
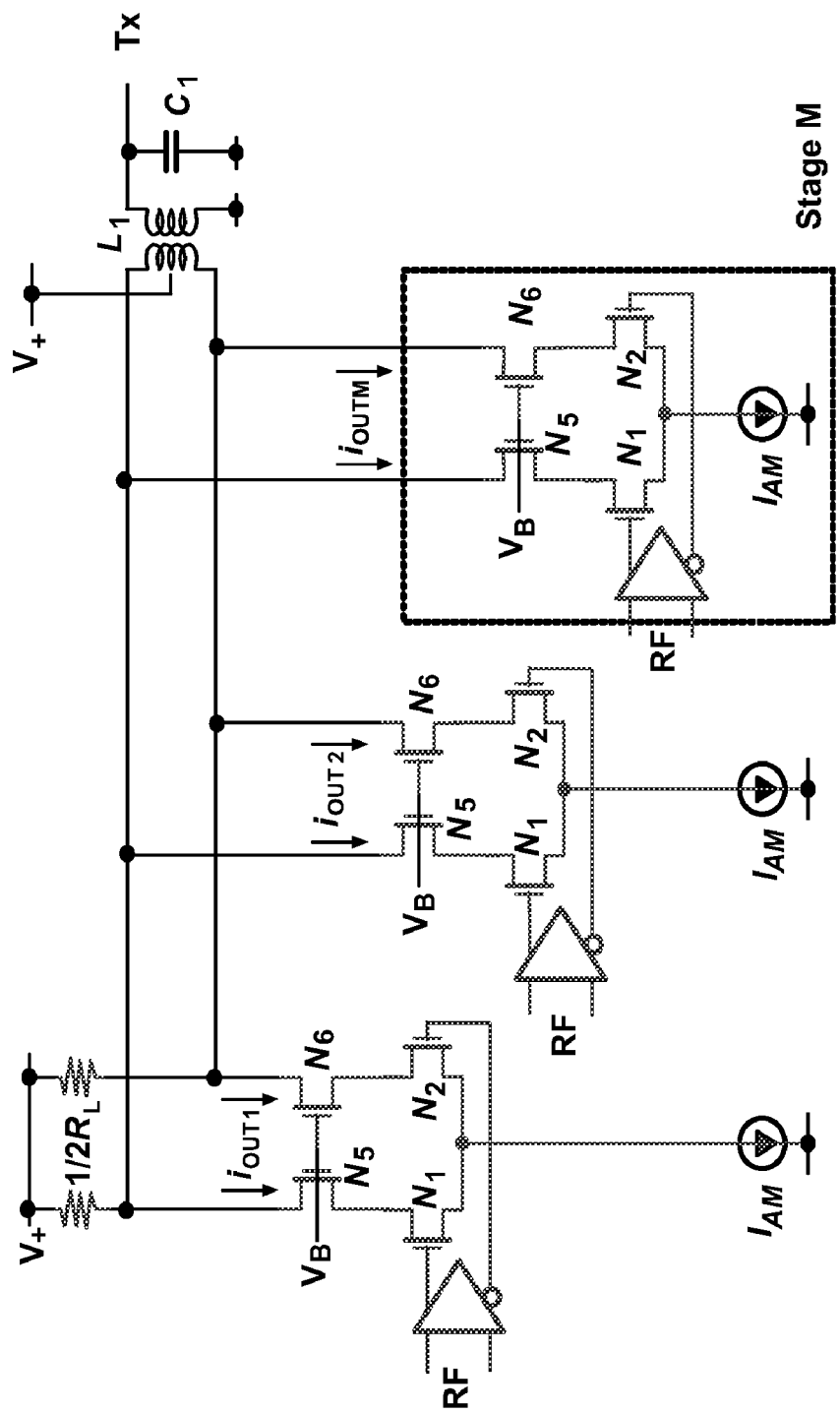
FIG. 4(a) is a schematic of an embodiment of a commutating amplifier comprising M shunt stages, in accordance with aspects of the present invention.
Figure 4B:
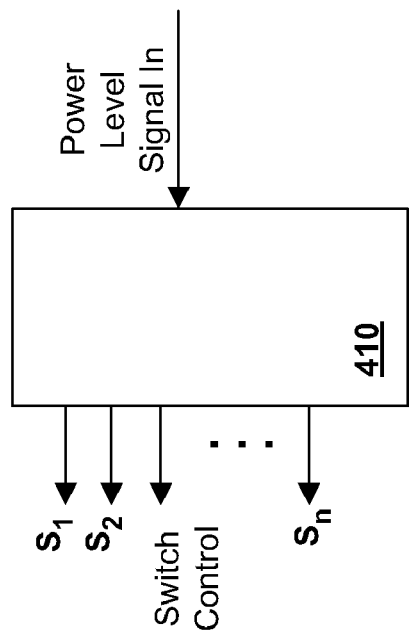
FIG. 4(b) is a schematic of an embodiment of a commutating amplifier with switches to disable it and minimize feedthrough, in accordance with aspects of the present invention.
Figure 4B:
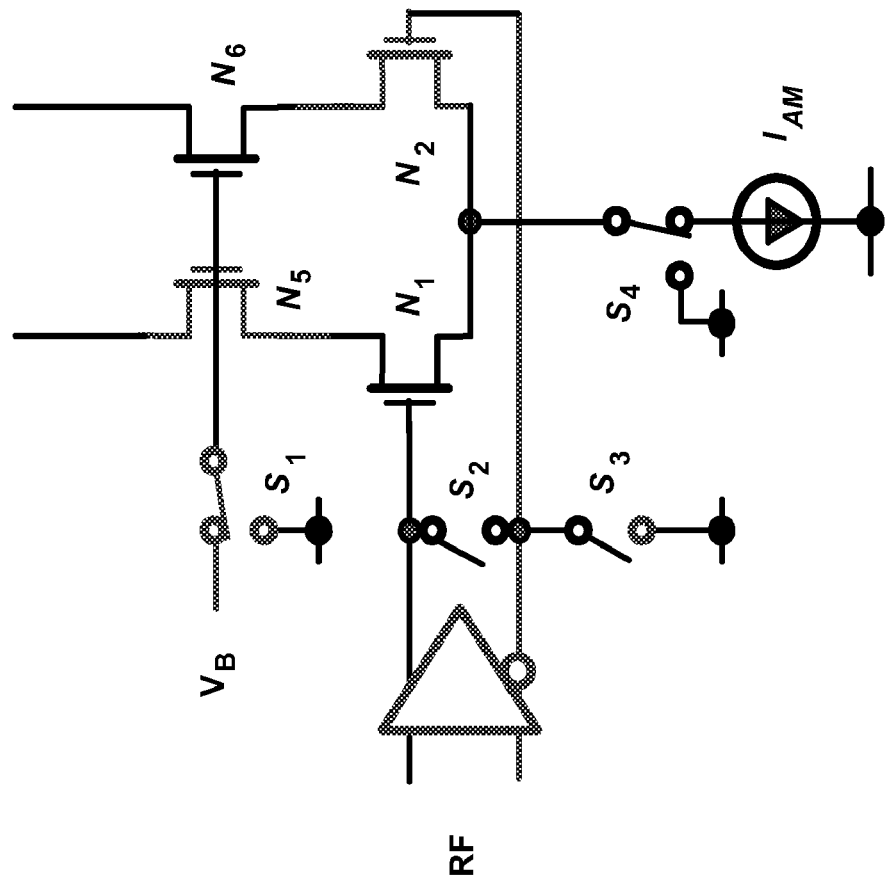
Figure 4C:
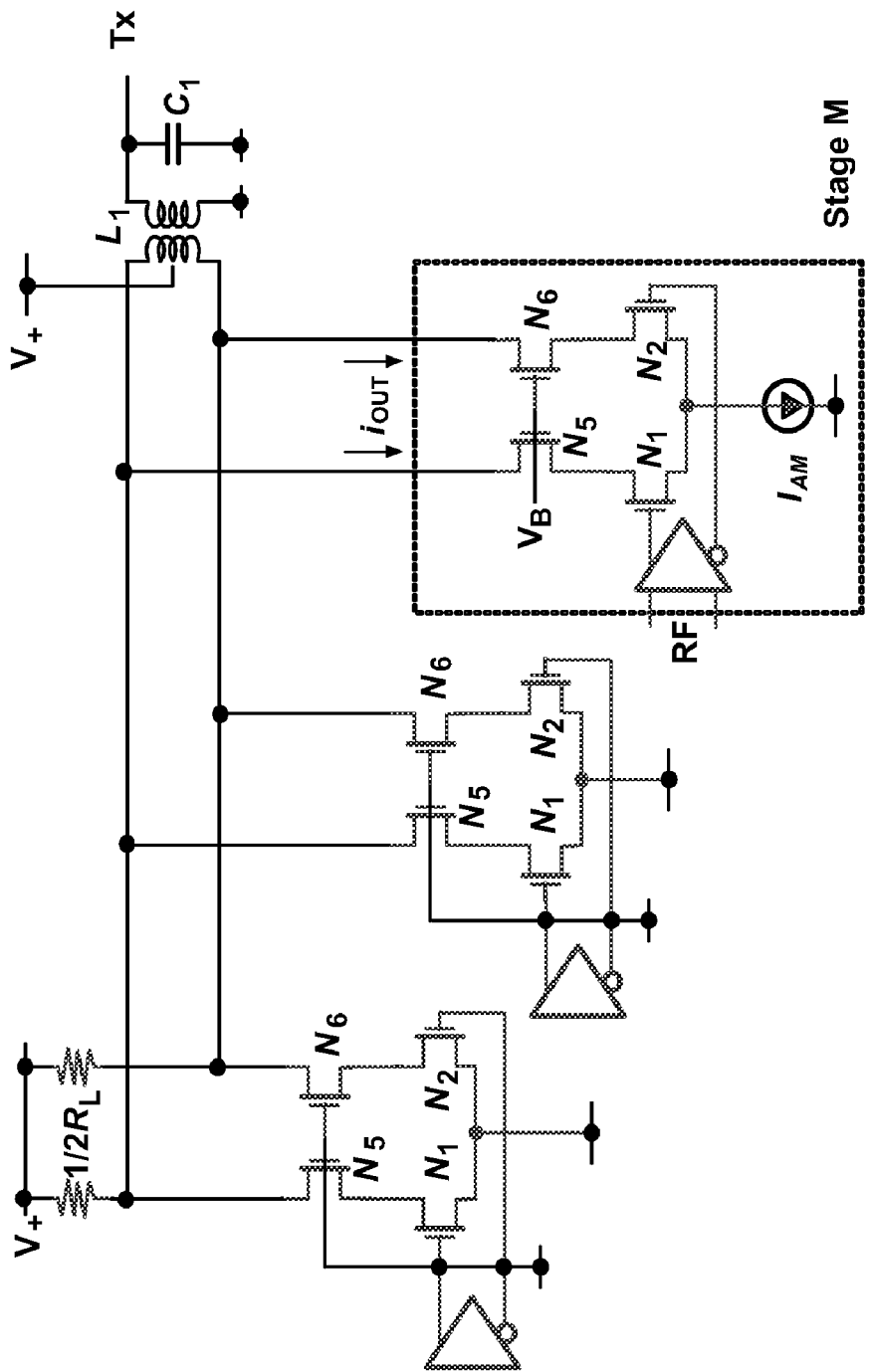
FIG. 4(c) is a schematic of an embodiment of a commutating amplifier comprising M shunt stages, with only the low power stage active, in accordance with aspects of the present invention.

In accordance with aspects of the present invention, an alternate approach to achieving a wide dynamic range by splitting the driver structure into two or more stages (denoted as stages 1 through M), as illustrated in the embodiment of FIG. 4a, may be used. This approach may allow for removal of a large part of the coupling path at low power levels. To improve isolation, the off buffer stages may be disabled, their outputs may be shorted together, and the cascode devices may be biased to ground as shown in FIG. 4b. A power control algorithm and associated process and hardware and/or software apparatus 410 may be used to configure and set switches $S_1$-$S_4$ according to the desired transmit power level, with the potential advantage of virtually eliminating the leakage path for any inactive circuitry. This may be based on, for example, mapping an input power signal associated with the amplitude modulation level and/or transmit power level to a set of the switches in order to provide a particular output power level. For example, at low power, only a single stage may be set to be operational in order to improve dynamic range as is shown in FIG. 4c, whereas one or more of stages 1-M may be switched in or out to dynamically adjust power level to higher levels based on the desired power and/or power level signal.

With M stages, the output of the shunted driver (at the RF carrier frequency) becomes:

$$v_{out}(t) = \frac{2}{\pi} \sum_{M \, stages} i_{AM}(t) R_{L\mathit{eff}}$$

where the summation combines the active stages feeding currents $Mi_{AM}(t)$ to the effective output load $R_{L\mathit{eff}}$. The currents $Mi_{AM}(t)$ can be equal, linear weighted, binary weighted (i.e. 1, ½, ¼, ⅛, etc.), logarithmically weighted, exponentially weighted, quadratically weighted, and/or weighted in a variety of other combinations as are known or developed in the art. At minimum power, the coupling factor will typically be at least $1/M^{th}$ the value at full output power. As a potential added advantage, this topology may also aggressively reduce current consumption in the driver at low and even moderate power levels.

Figure 5A:
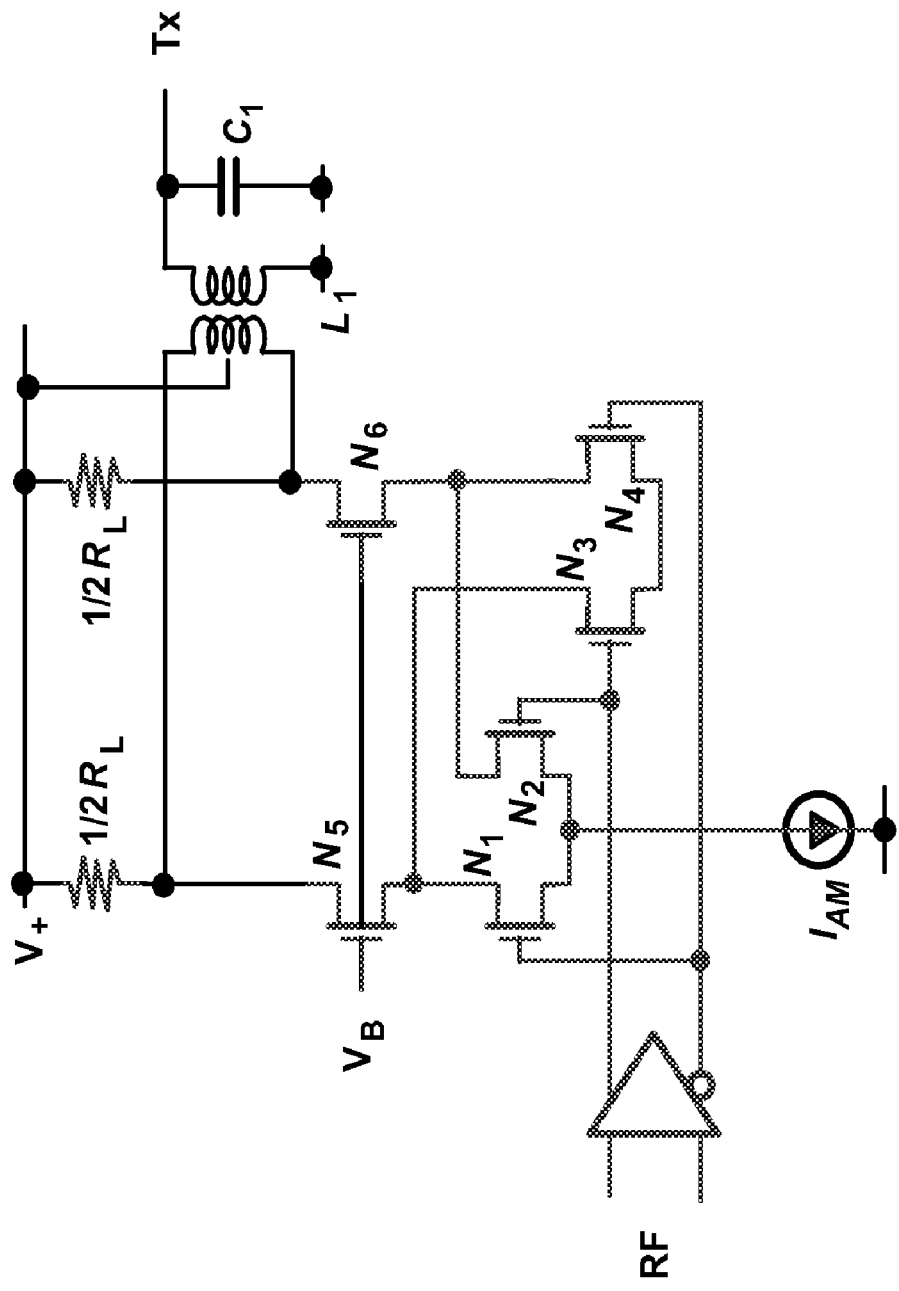
FIG. 5(a) is a schematic of an embodiment of a commutating amplifier stage using cross-coupled devices to reduce feedthrough, in accordance with aspects of the present invention.
Figure 5B:
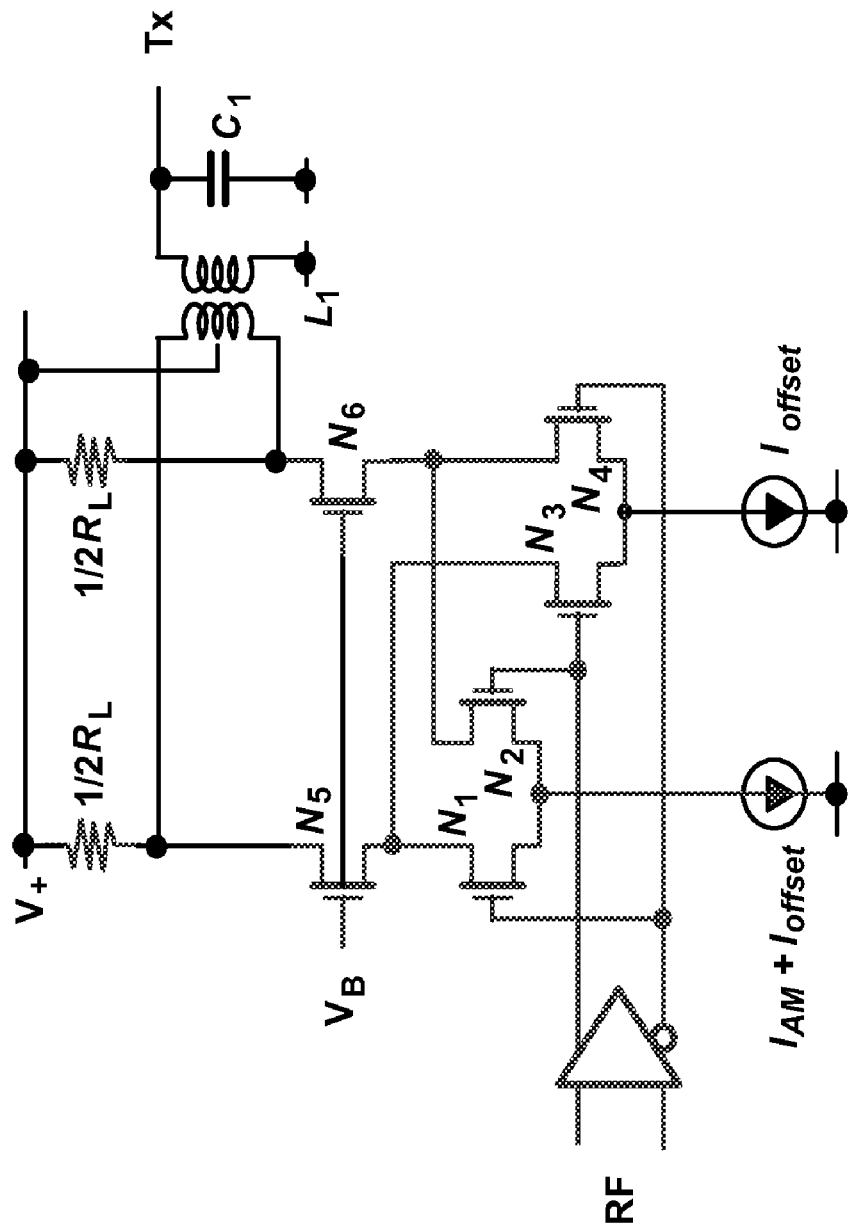
FIG. 5(b) is a schematic of an embodiment of a commutating amplifier stage using cross coupled devices with an applied offset current, in accordance with aspects of the present invention.

It is also possible to improve isolation and dynamic range by cancelling RF carrier feedthrough. This may be accomplished by adding a cross-coupled differential pair to one or more commutating amplifier stages as shown in FIG. 5a. Devices $N_3$-$N_4$ are typically sized to match devices $N_1$-$N_2$. This creates a feedthrough path that ideally matches and (since it's cross-coupled in an opposite fashion) cancels any signal coupled to the output by the original feedback path. In some embodiments, it may be desirable to bias the second differential pair with an offset current, $I_{\mathit{offset}}$, as shown in FIG. 5b. It may also be desirable to add an equal offset current to the original differential pair consisting of transistors $N_1$-$N_2$ to avoid distortion.

Figure 6:
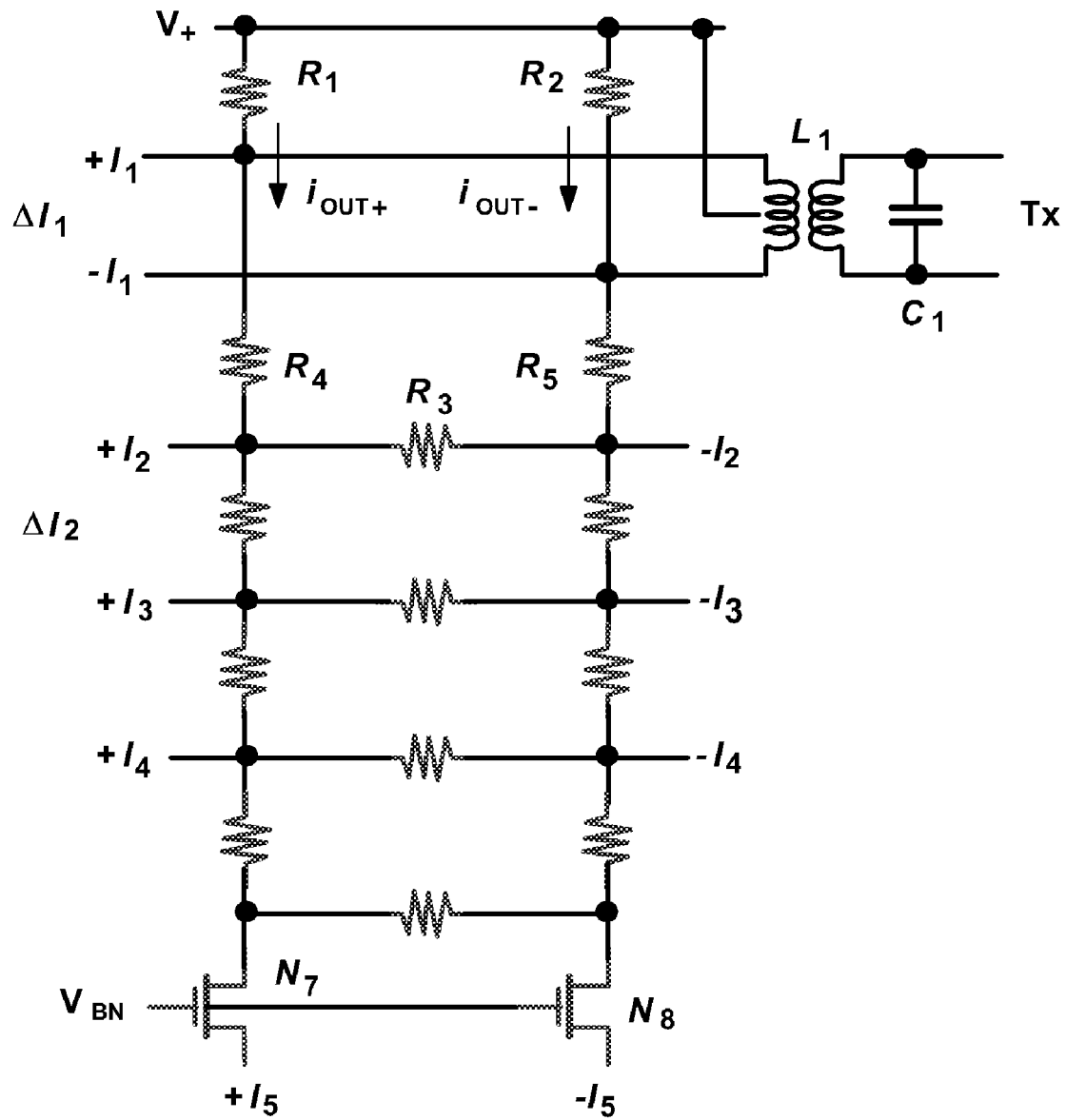
FIG. 6 is a schematic of an R-2R ladder used to scale the output power level of the commutating amplifier's low power stage, in accordance with aspects of the present invention.

To extend the driver's dynamic range even further, the lowest power stage may tap into an R-2R ladder as shown in FIG. 6. The resistor ladder steers the RF currents in a way that reduces their difference at the output load. The RF current may connect to the ladder at one of the designated tap points using the cascode stages as switches. The shunt stages may connect to the top taps (+$I_1$ and −$I_1$). Connecting the lowest power stage (or a dedicated copy of the stage) to the second taps splits the output currents (+$I_2$ and −$I_2$) in a way that reduces the output current by a factor of two and consequently lowers the output power by 6 dB. Each lower tap on the R-2R ladder reduces the output power by an additional 6 dB such that:

$$\Delta I_{out} = I_{out+} - I_{out-}$$

$$= \Delta I_N \left( \frac{1}{2^{N-1}} \right)$$

for an N-tap R-2R ladder, without changing the resistance seen in parallel with load resistors $R_L$. In practice, the active stage may be a combination of stages that can be selected to provide finer control than the 6 dB steps provided by the R-2R ladder. Alternatively, the signal current $i_{AM}(t)$ may be scaled according to:

$$i_{AM}(t) \rightarrow p_{Tx} \times i_{AM}(t)$$

where $p_{Tx}$ signifies the designated power control level.

Figure 7:
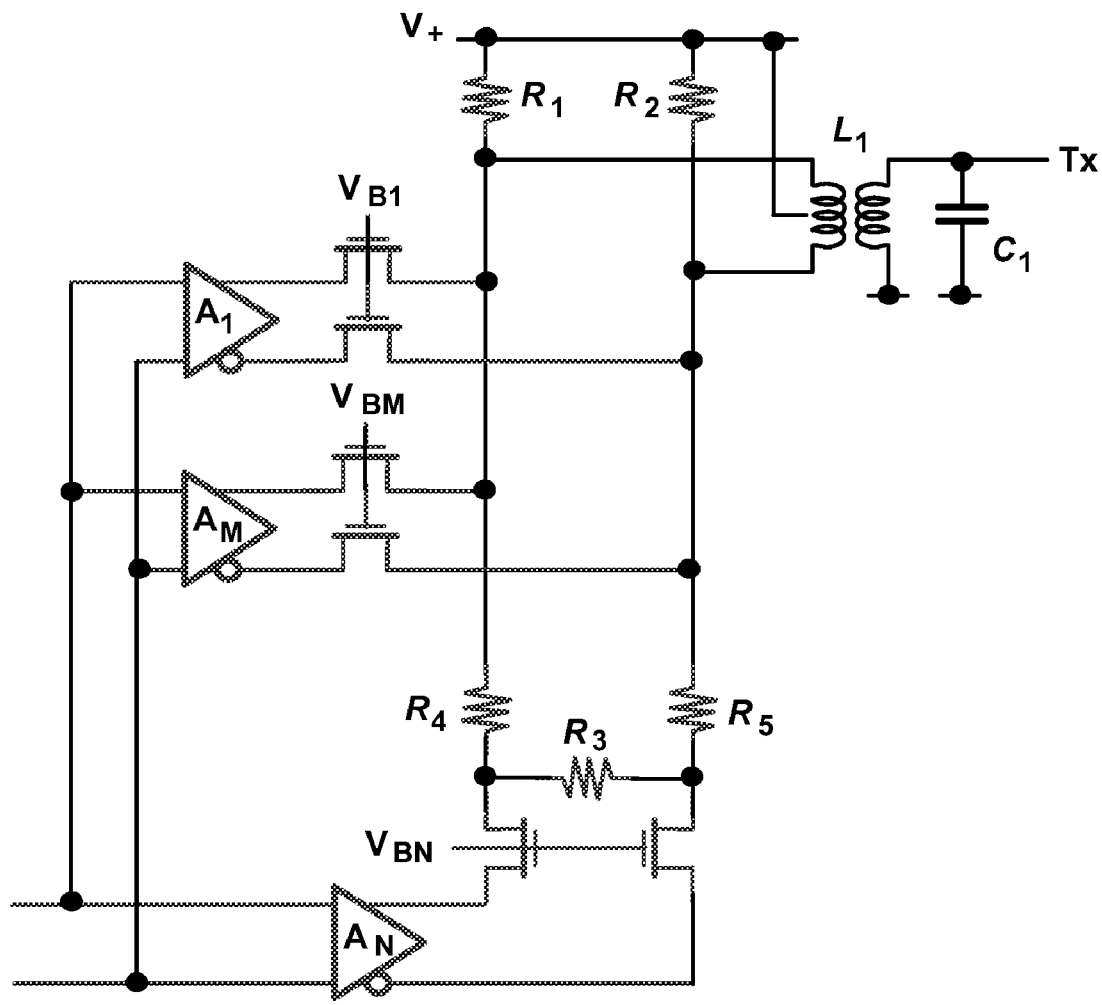
FIG. 7 is a schematic of a commutating amplifier having extended dynamic range, in accordance with aspects of the present invention.

The shunt driver stages and R-2R ladder network may be combined as illustrated in FIG. 7 to expand the dynamic range of the commutating amplifier. In addition, this approach may extend the power control range in a very efficient manner.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. A commutating amplifier apparatus for use in a polar modulator, comprising:
   a first commutating amplifier stage coupled to a load stage;
   a second commutating amplifier stage coupled in parallel with the first commutating amplifier stage and the load stage; and
   a switching apparatus, said switching apparatus configured to provide control of said selective switching of said first and said second commutating amplifier stages
   wherein each of said first and said second commutating amplifier stages are configured to provide a predefined scaled output and wherein each of said commutating amplifier stages are configured to be selectively switched on or off in response to a switching signal;
   wherein each of said first and said second commutating amplifier stages has an efficiency substantially independent of peak-to-average ratio of an input signal coupled to each of said first and said second commutating amplifier stages; and
   wherein said switching apparatus comprises a switching circuit configured to receive a power control signal associated with a desired output level and provide one or more switching signals to control switching of said first and said second commutating amplifier stages.

2. The apparatus of claim 1 wherein said power control signal comprises an amplitude modulation signal.

3. The apparatus of claim 1 wherein said power control signal comprises an amplitude modulation signal combined with a transmit power level signal.

4. A commutating amplifier apparatus for use in a polar modulator, comprising:
a first commutating amplifier stage coupled to a load stage;
a second commutating amplifier stage coupled in parallel with the first commutating amplifier stage and the load stage;
a first pair of transistors coupled to the load and a bias signal provided to the first commutating amplifier stage; and
a second pair of transistors, coupled to the first pair of transistors, said second pair of transistors comprising an RF switching pair coupled to an RF signal provided to the first commutating amplifier stages;
wherein each of said first and said second commutating amplifier stages are configured to provide a predefined scaled output and wherein each of said commutating amplifier stages are configured to be selectively switched on or off in response to a switching signal;
wherein each of said first and said second commutating amplifier stages has an efficiency substantially independent of peak-to-average ratio of an input signal coupled to each of said first and said second commutating amplifier stages; and
wherein said second pair of transistors are further coupled to an amplitude signal provided to the first and second commutating amplifier stages.

5. The apparatus of claim 4 wherein said amplitude signal is a current signal.

6. The apparatus of claim 5 wherein said amplitude signal comprises an amplitude modulation signal.

7. The apparatus of claim 5 wherein said amplitude signal comprises an amplitude modulation signal combined with a transmit power level signal.

8. A commutating amplifier apparatus for use in a polar modulator, comprising:
a first commutating amplifier stage coupled to a load stage; and
a second commutating amplifier stage coupled in parallel with the first commutating amplifier stage and the load stage;
wherein each of said first and said second commutating amplifier stages are configured to provide a predefined scaled output and wherein each of said commutating amplifier stages are configured to be selectively switched on or off in response to a switching signal;
wherein each of said first and said second commutating amplifier stages has an efficiency substantially independent of peak-to-average ratio of an input signal coupled to each of said first and said second commutating amplifier stages; and
wherein said first commutating amplifier stage is configured as a cross-coupled differential pair, wherein said cross-coupled differential pair comprises:
a first pair of transistors comprising a first transistor and a second transistor, said first pair of transistors coupled to the load and a bias signal provided to the first commutating amplifier stage;
a second pair of transistors comprising a first RF switching pair, said second pair of transistors coupled to the first pair of transistors, an RF signal provided to the first commutating amplifier stage, and an amplitude signal provided to the first commutating amplifier stage; and
a third pair of transistors comprising a second RF switching pair, said third pair of transistors coupled to the first pair of transistors and the RF signal;
wherein said first RF switching pair and said second RF switching pair are cross-coupled to cancel signals coupled to the output by a feedthrough path.

9. The apparatus of claim 8 wherein said amplitude signal is a current signal.

10. The apparatus of claim 9 wherein said amplitude signal comprises an amplitude modulation signal.

11. The apparatus of claim 9 wherein said amplitude signal comprises an amplitude modulation signal combined with a transmit power level signal.

12. The apparatus of claim 8 further comprising a bias circuit configured to apply an offset current to said first and said second RF switching pairs to reduce distortion.

13. The apparatus of claim 12 wherein said bias circuit comprises a first circuit to combine said offset current with said amplitude signal and a second circuit to couple said offset current to said second RF switching pair.

14. A commutating amplifier apparatus for use in a polar modulator, comprising:
a plurality of commutating amplifier stages, wherein ones of the plurality of commutating amplifier stages are coupled to a load stage; and
a switching apparatus coupled to the ones of the plurality of commutating amplifier stages, wherein said switching apparatus is disposed to switch one or more of said plurality of commutating amplifier stages on or off in response to a power control signal, and wherein one or more of said plurality of commutating amplifier stages has an efficiency substantially independent of peak-to-average ratio of an input signal coupled to one or more of said plurality of commutating amplifier stages;
wherein said ones of said plurality of commutating amplifier stages are configured to provide a predefined scaled output;
wherein said switching apparatus comprises a switching circuit configured to receive the power control signal, wherein the power control signal is associated with a desired output power level, and provide a plurality of switching signals to control switching of said one or more of said plurality of commutating amplifier stages.

15. The apparatus of claim 14 wherein said power control signal comprises an amplitude modulation signal.

16. The apparatus of claim 14 wherein said power control signal comprises an amplitude modulation signal combined with a transmit power level signal.

17. The apparatus of claim 14 wherein one or more of said plurality of commutating amplifier stages comprises:
a first pair of transistors coupled to the load and a bias signal provided to the commutating amplifier stage; and
a second pair of transistors, coupled to the first pair of transistors, said second pair of transistors comprising an RF switching pair coupled to an RF signal provided to the commutating amplifier stage;
wherein the second pair of transistors are further coupled to an amplitude signal provided to the commutating amplifier stage.

18. The apparatus of claim 15 wherein said amplitude signal is a current signal.

19. The apparatus of claim 18 wherein said amplitude signal comprises an amplitude modulation signal.

20. The apparatus of claim 18 wherein said amplitude signal comprises an amplitude modulation signal combined with a transmit power level signal.

21. The apparatus of claim 14 wherein one or more of said commutating amplifier stages is configured as a cross-coupled differential pair and wherein said cross-coupled differential pair comprises:

a first pair of transistors comprising a first transistor and a second transistor, said first pair of transistors coupled to the load and a bias signal provided to the commutating amplifier stage;

a second pair of transistors comprising a first RF switching pair, said second pair of transistors coupled to the first pair of transistors, an RF signal provided to the commutating amplifier stage, and an amplitude signal provided to the commutating amplifier stage; and a third pair of transistors comprising a second RF switching pair, said third pair of transistors coupled to the first pair of transistors and the RF signal;

wherein said first RF switching pair and said second RF switching pair are cross-coupled to cancel signals coupled to the output by a feedthrough path.

22. The apparatus of claim 21 further comprising a bias circuit configured to apply an offset current to said first and said second RF switching pairs to reduce distortion.

23. The apparatus of claim 22 wherein said bias circuit comprises a first circuit to combine said offset current with said amplitude signal and a second circuit to couple said offset current to said second RF switching pair.

24. A method of providing an output signal in a polar modulator, comprising:

receiving, at a switching apparatus, a power control signal;

generating, based on the power control signal, a plurality of switching signals; and switching on or off, based at least in part on one or more of said switching signals, the output of one or more of a plurality of commutating amplifier stages coupled to an output load of the polar modulator, wherein one or more of said plurality of commutating amplifier stages has an efficiency substantially independent of peak-to-average ratio of an input signal coupled to one or more of said plurality of commutating amplifier stages;

wherein said plurality of commutating amplifier stages are configured to provide a predefined scaled output; and wherein said power control signal comprises an amplitude modulation signal.

25. The method of claim 24 wherein said power control signal comprises an amplitude modulation signal combined with a transmit power level signal.

* * * * *